United States Patent
Hsieh et al.

(10) Patent No.: US 9,990,530 B2
(45) Date of Patent: Jun. 5, 2018

(54) FINGERPRINT SENSING DEVICE

(71) Applicant: AU OPTRONICS CORPORATION, Hsin-chu (TW)

(72) Inventors: Hao-Lun Hsieh, Hsin-chu (TW); Ching-Wen Chen, Hsin-chu (TW); Rong-Ann Lin, Hsin-chu (TW); Ming-I Huang, Hsin-chu (TW); Chun Chang, Hsin-chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 114 days.

(21) Appl. No.: 15/254,164

(22) Filed: Sep. 1, 2016

(65) Prior Publication Data
US 2017/0213066 A1  Jul. 27, 2017

(30) Foreign Application Priority Data
Jan. 21, 2016  (TW) .............................. 105101865 A

(51) Int. Cl.
| | |
|---|---|
| *G06K 9/00* | (2006.01) |
| *H01L 29/868* | (2006.01) |
| *H01L 51/52* | (2006.01) |
| *H01L 27/32* | (2006.01) |
| *H01L 51/50* | (2006.01) |

(Continued)

(52) U.S. Cl.
CPC .......... *G06K 9/0004* (2013.01); *H01L 29/868* (2013.01); *H01L 51/5281* (2013.01); *H01L 25/167* (2013.01); *H01L 27/3234* (2013.01); *H01L 29/872* (2013.01); *H01L 51/5056* (2013.01); *H01L 51/5072* (2013.01); *H01L 51/5088* (2013.01); *H01L 51/5092* (2013.01)

(58) Field of Classification Search
CPC ......... H01L 2251/5338; H01L 51/5281; H01L 25/167; H01L 27/3227; H01L 29/872; H01L 29/868; H01L 27/3234; H01L 51/5056; H01L 51/5072; H01L 51/5088; H01L 51/5092; G06F 3/044; G06F 21/32; A61B 5/1172; G06K 9/0004
See application file for complete search history.

(56) References Cited

U.S. PATENT DOCUMENTS

| | | | |
|---|---|---|---|
| 7,349,562 B2 * | 3/2008 | Ogura ................. | G06K 9/0004 250/556 |
| 8,250,387 B2 * | 8/2012 | Tsukamoto ............... | G06F 1/26 713/300 |

(Continued)

*Primary Examiner* — Manav Seth
(74) *Attorney, Agent, or Firm* — Tim Tingkang Xia, Esq.; Locke Lord LLP

(57) ABSTRACT

A fingerprint sensing device includes a plurality of sensing units. Each sensing unit includes: a readout element, a photosensitive element, a light emitting element and a diode. The photosensitive element is electrically connected to the readout element. The light emitting element is disposed corresponding to the photosensitive element, and includes a first anode, a first cathode, and a light emitting layer located between the first anode and the first cathode. The diode includes a second anode and a second cathode, and a semiconductor layer located between the second anode and the second cathode. The second anode is electrically connected to the first cathode of the light emitting element, and the second cathode is electrically connected to the first anode of the light emitting element.

15 Claims, 4 Drawing Sheets

(51) Int. Cl.
   *H01L 25/16*   (2006.01)
   *H01L 29/872*  (2006.01)

(56) References Cited

U.S. PATENT DOCUMENTS

| | | | |
|---|---|---|---|
| 9,349,758 B2* | 5/2016 | Ki | H01L 29/78672 |
| 9,583,739 B2* | 2/2017 | Hirakata | H01L 51/5209 |
| 9,797,567 B2* | 10/2017 | Kastner-Jung | F21S 10/02 |
| 9,836,165 B2* | 12/2017 | Nho | G06F 3/0421 |
| 9,893,102 B2* | 2/2018 | Raguin | H01L 27/14601 |
| 2001/0030324 A1* | 10/2001 | Morikawa | H01L 27/14609 257/59 |
| 2004/0252867 A1* | 12/2004 | Lan | G06K 9/0004 382/124 |
| 2006/0180890 A1 | 8/2006 | Naugler, Jr. et al. | |
| 2010/0156851 A1 | 6/2010 | Kurokawa | |
| 2010/0321341 A1* | 12/2010 | Cho | G06F 3/0412 345/175 |

* cited by examiner

FINGERPRINT SENSING DEVICE

CROSS-REFERENCE TO RELATED APPLICATION

This non-provisional application claims priority to and benefit of, under 35 U.S.C. § 119(a), Patent Application No. 105101865 filed in Taiwan R.O.C. on Jan. 21, 2016, the entire content of which is hereby incorporated by reference.

TECHNICAL FIELD

The present disclosure relates to a fingerprint sensing device, and more particularly to a fingerprint sensing device usable under strong outdoor light.

BACKGROUND ART

A fingerprint is an optimal biometric password with uniqueness. With the maturation and popularization of identification apparatuses and technologies, in addition to access control for house protection, personal documents, ID authentication in payment systems, and places where strict access control is required, recently, fingerprint sensing devices have also been commonly used in mobile devices for application identification.

For traditional fingerprint sensing devices, backlight is transmitted through a photosensitive element to reach a finger, where a fingerprint of the finger reflects the light with crests and troughs. The photosensitive element receives the reflected light to detect the difference between the crests and the troughs, thereby sensing the fingerprint. However, traditional fingerprint sensing devices have a problem of image overexposure under strong outdoor light. In particular, due to a wavelength of sunlight above 600 nm, too much light is transmitted through the finger, causing the photoelectric current of the photosensitive element to be over-saturated. In other words, if a mobile device with traditional fingerprint sensing devices is used outdoors, it is usually difficult to read the images of fingerprints. Accordingly, how to solve the problem of existing fingerprint sensing devices not being useful under strong outdoor light is an issue to be addressed at present.

SUMMARY OF THE INVENTION

The present disclosure provides a fingerprint sensing device, which can solve the problem that traditional fingerprint sensing devices cannot be used under strong outdoor light.

The fingerprint sensing device of the present disclosure comprises a plurality of sensing units, where each of the sensing units comprises a readout element, a photosensitive element, a light emitting element, and a diode. The photosensitive element is electrically connected to the readout element. The light emitting element is disposed corresponding to the photosensitive element and comprises a first anode, a first cathode, and a light emitting layer located between the first anode and the first cathode. The diode comprises a second anode and a second cathode, and a semiconductor layer located between the second anode and the second cathode. The second anode is electrically connected to the first cathode of the light emitting element and the second cathode is electrically connected to the first anode of the light emitting element.

Based on the above, in the fingerprint sensing device of the present disclosure, the light emitting element is disposed corresponding to the photosensitive element, the second anode of the diode is electrically connected to the first cathode of the light emitting element, and the second cathode is electrically connected to the first anode of the light emitting element. Thus, the fingerprint sensing device of such an architecture can completely obstruct the front light, solve the problem of not being able to read under sunlight, and form a light emitting mechanism in which the light emitting element is controlled by ridges of fingerprints.

To make the above characteristics and advantages of the present disclosure clearer and easier to understand, the following embodiments are described in detail in conjunction with accompanying figures.

BRIEF DESCRIPTIONS OF THE DRAWINGS

DETAILED DESCRIPTIONS OF THE INVENTION

Figure 1A:
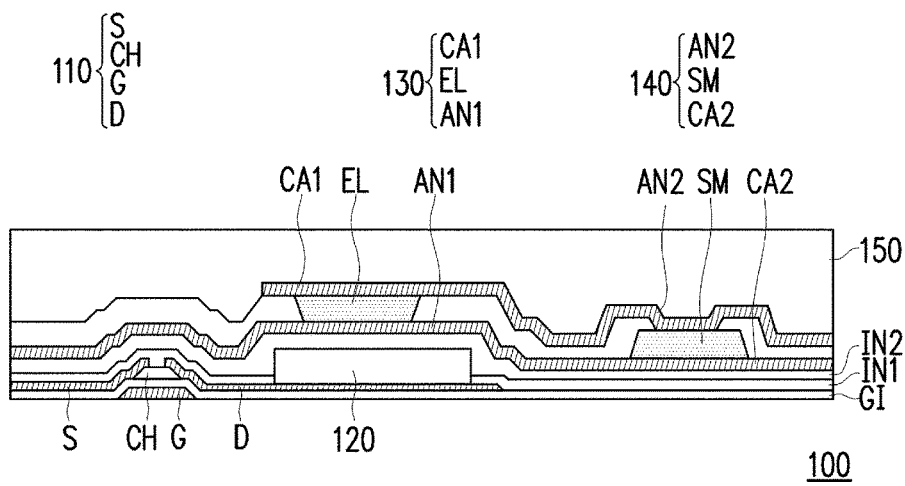
FIG. 1A is a schematic sectional view of a sensing unit of a fingerprint sensing device according to one embodiment of the present disclosure.
Figure 1B:
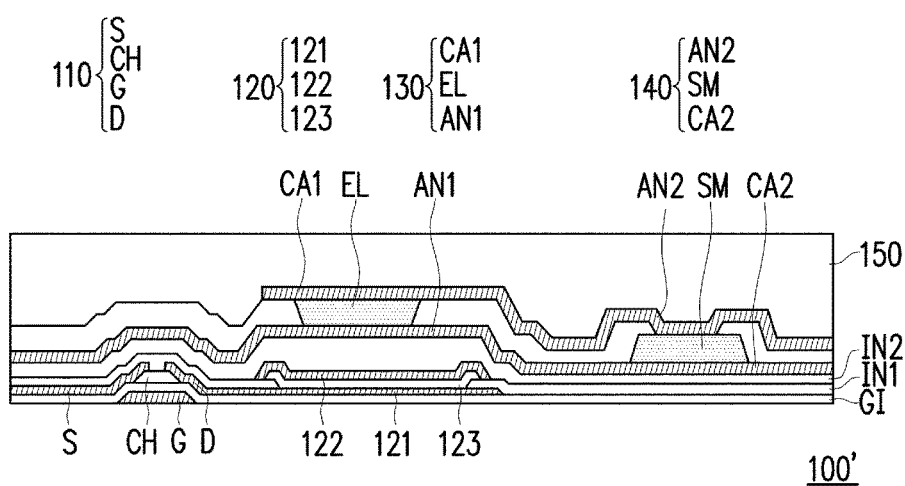
FIG. 1B shows a first variant of the sensing unit of the fingerprint sensing device in FIG. 1A.
Figure 1C:
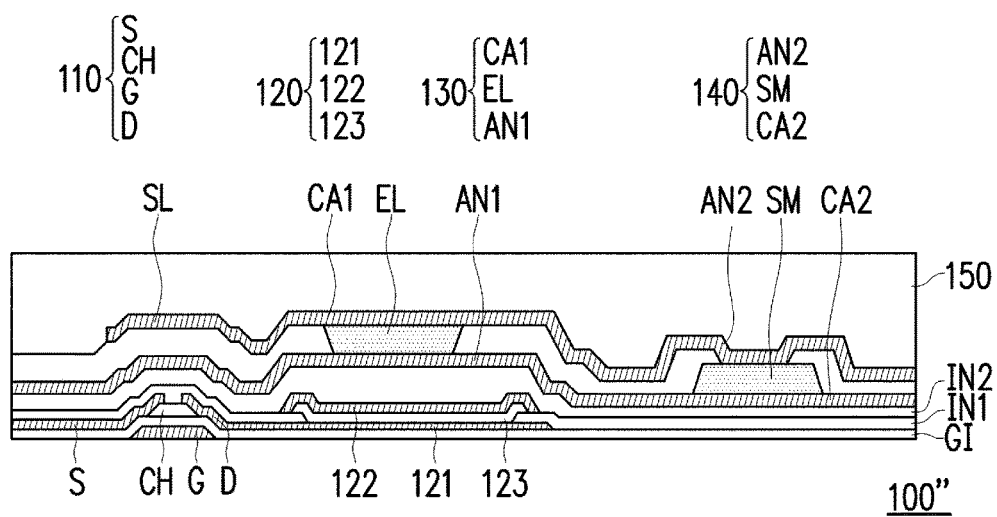
FIG. 1C shows a second variant of the sensing unit of the fingerprint sensing device in FIG. 1A.
Figure 1D:
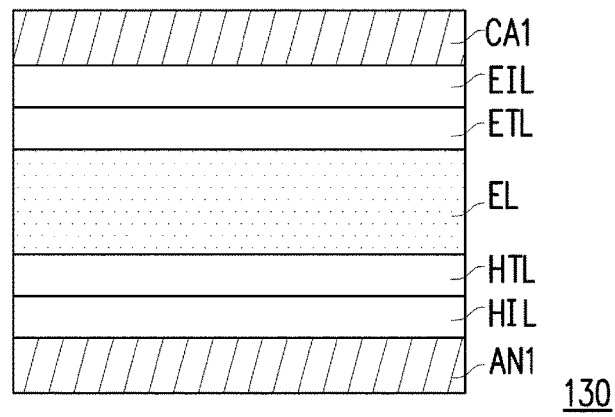
FIG. 1D is a schematic sectional view of the light emitting element in the embodiment in FIG. 1A.

FIG. 1A is a schematic sectional view of a sensing unit of a fingerprint sensing device according to one embodiment of the present disclosure. FIG. 1B shows a first variant of the sensing unit of the fingerprint sensing device in FIG. 1A. FIG. 1C shows a second variant of the sensing unit of the fingerprint sensing device in FIG. 1A. FIG. 1D is a schematic sectional view of the light emitting element in the embodiment in FIG. 1A. Please refer to FIG. 1A, FIG. 1B, FIG. 1C, and FIG. 1D at the same time. In the present embodiment, the fingerprint sensing device comprises a plurality of sensing units 100. Each of the sensing units 100 comprises a readout element 110, a photosensitive element 120, a light emitting element 130, a diode 140, and an encapsulating layer 150. The photosensitive element 120 is electrically connected to the readout element 110. In particular, the readout element 110 is an active element. The active element comprises a gate G, a channel CH, a source S, and a drain D. The gate G is located on a substrate (not shown) and is made of a metallic material or a conductive material, but the present disclosure is not limited thereto. A gate insulation layer GI may be formed on the gate G. The material of the gate insulation layer GI may be selected from an inorganic material, an organic material, a polymer, polyimide, or other suitable materials.

The channel layer CH is formed on the gate insulation layer GI. The source S and the drain D are formed above the channel layer CH, where the drain D is electrically connected to the photosensitive element 120. In particular, in the present embodiment, the drain D may extend to below the photosensitive element 120 and serve as a lower electrode of the photosensitive element 120. In operation, the photosensitive element 120 is configured to receive light and correspondingly output a sensing signal through the readout element 110. In addition, a dielectric layer IN1 covers the readout element 110 and a dielectric layer IN2 covers the photosensitive element 120.

In other variants, such as shown in the first variant in FIG. 1B, the photosensitive element 120 of the sensing unit 100' of the fingerprint sensing device may comprise a lower electrode 121 and an upper electrode 122 that are electrically connected to the drain D, and a photosensitive silicon-rich dielectric layer 123 may be used between the upper electrode 122 and the lower electrode 121, to provide good optical and electrical properties, but the present disclosure is not limited thereto and other conventional photosensitive elements 120 may be used. The variant in FIG. 1B is similar to the embodiment in FIG. 1A, except for the description of the photosensitive element 120. Thus, the same elements are represented by the same reference numerals and will not be described again.

In addition, as shown in the second variant in FIG. 1C, the sensing unit 100" of the fingerprint sensing device may further comprise a shading layer SL. The shading layer SL is disposed above the readout element 110, such that the readout element 110 will not be interfered with by ambient light. Particularly, when the channel layer CH of the readout element 110 is made of a photosensitive material, the shading layer SL can prevent the ambient light from affecting signal readout. In one embodiment, when a light emitting element 130 is being fabricated, a CA1 metal layer may be extended to above the readout element 110 and serve as the shading layer SL to cover the readout element 110. The embodiment in FIG. 1C is similar to the embodiment in FIG. 1B, except for the description of the shading layer SL above the readout element 110. Thus, the same elements are represented by the same reference numerals and will not be described again.

In the above embodiments, the light emitting element 130 is disposed corresponding to the photosensitive element 120, and comprises a first anode AN1, a first cathode CA1, and a light emitting layer EL between the first anode AN1 and the first cathode CA1. The light emitting element 130 is located above the photosensitive element 120. The light emitting element 130 and the photosensitive element 120 have a vertically stacked structure. In particular, a vertical projection of the light emitting element 130 at least partially overlaps a vertical projection of the photosensitive element 120. In the present embodiment, the light emitting layer EL of the light emitting element 130 is located above the first anode AN1 and the first cathode CA1 is located above the light emitting layer EL. The first anode AN1 is located in the light emitting element 130 at a side close to the photosensitive element 120. The first anode AN1 is made of a transparent conductive material, such as indium tin oxide (ITO), but the present disclosure is not limited thereto. The first cathode CA1 is located at the uppermost position in the light emitting element 130, serves as a separate metal layer of each sensing unit 100, and can be used to block sunlight. That is to say, the first cathodes CA1 of the sensing units 100 in the present embodiment are not contacted with each other and are each a floating electrode.

Referring to FIG. 1D, the light emitting element 130 further comprises an electron injection layer EIL located between the first cathode CA1 and the light emitting layer EL and an electron transport layer ETL located between the electron injection layer EIL and the light emitting layer EL. In addition, the light emitting element 130 further comprises a hole injection layer HIL located between the first anode AN1 and the light emitting layer EL and a hole transport layer HTL located between the hole injection layer HIL and the light emitting layer EL. Then, referring to FIG. 1A, the diode 140 comprises a second anode AN2 and a second cathode CA2, and a semiconductor layer SM located between the second anode AN2 and the second cathode CA2. The semiconductor layer SM of the diode 140 is located above the second cathode CA2, and the second anode AN2 is located above the semiconductor layer SM. In particular, the second anode AN2 is electrically connected to the first cathode CA1 of the light emitting element 130, and the second cathode CA2 is electrically connected to the first anode AN1 of the light emitting element 130. In the present embodiment, the first cathode CA1 and the second anode AN2 are the same film layer, and the first anode AN1 and the second cathode CA2 are the same film layer. In other words, the material of the second cathode CA2 is the same as that of the first anode AN1 and is a transparent conductive material, such as indium tin oxide (ITO), but the present disclosure is not limited thereto. In addition, the second anode AN2 is located at the uppermost position in the diode 140, serves as a separate metal layer of each sensing unit 100, and can be used to block sunlight. That is to say, the second anodes AN2 of the sensing units 100 in the present embodiment are not contacted with each other and are each a floating electrode.

In the present embodiment, the semiconductor layer SM is not limited in particular and may include, for example, the four types of structures listed below. The first structure is a PIN diode, comprising a P-type material layer, an N-type material layer, and an intrinsic material layer. The P-type material layer is electrically connected to the second anode AN2, the N-type material layer is electrically connected to the second cathode CA2, and the intrinsic material layer is located between the P-type material layer and the N-type material layer. The second structure is a PN diode, comprising a P-type material layer and an N-type material layer. The P-type material layer is electrically connected to the second anode AN2 and the N-type material layer is electrically connected to the second cathode CA2. The third structure is an N-i type diode, comprising an N-type material layer and an intrinsic material layer. The N-type material layer is electrically connected to the second cathode CA2 and the intrinsic material layer is electrically connected to the second anode AN2. The fourth structure is a P-i diode, comprising a P-type material layer and an intrinsic material layer. The P-type material layer is electrically connected to the second anode AN2 and the intrinsic material layer is electrically connected to the second cathode CA2. Accordingly, a suitable structure may be provided as required to serve as the semiconductor layer SM.

Figure 2:
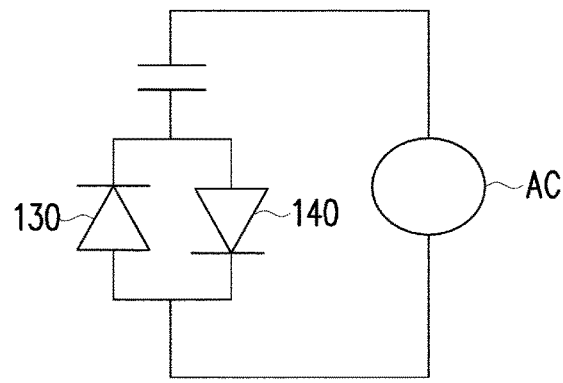
FIG. 2 is an equivalent circuit diagram of a fingerprint sensing device according to one embodiment of the present disclosure.

Referring to FIG. 1A, FIG. 1B, and FIG. 1C, the encapsulating layer 150 is configured to cover the readout element 110, the photosensitive element 120, the light emitting element 130, and the diode 140. The encapsulating layer 150 may be a transparent material or an opaque material. In the embodiment in FIG. 1A to FIG. 1D, the light emitting element 130 and the diode 140 do not overlap. In particular, the light emitting element 130 and the diode 140 are of a parallel structure. FIG. 2 is an equivalent circuit diagram of a fingerprint sensing device according to one embodiment of the present disclosure. Referring to FIG. 2, the light emitting element 130 and the diode 140 in the present embodiment are of a parallel structure and an alternating current driving power supply AC is comprised. In addition, in the present embodiment, the alternating current driving power supply AC is used to drive an equivalent capacitor, and two diodes having opposite polarities are connected with each other in parallel at a side of the capacitor to form a current loop. In the present embodiment, the light emitting element 130 is an organic light emitting diode (OLED) and the diode 140 is a Schottky contact diode, but the present disclosure is not limited thereto in particular.

Figure 3A:
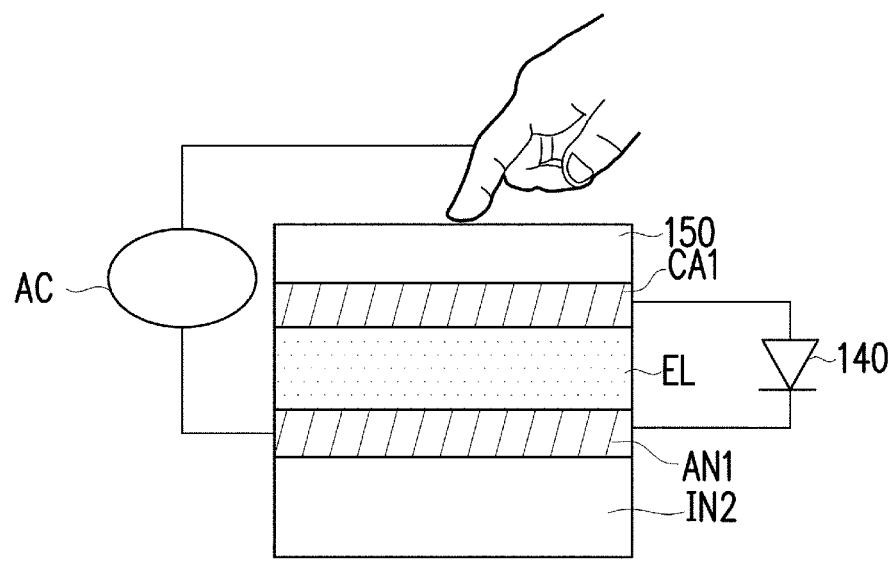
FIG. 3A and FIG. 3B are schematic views of a light emitting mechanism of a fingerprint sensing device according to one embodiment of the present disclosure.
Figure 3B:
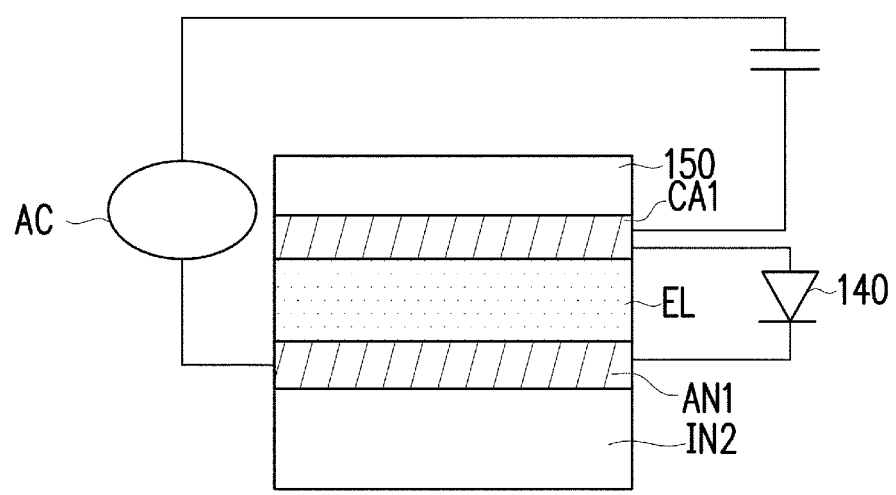

Next, a light emitting mechanism of a fingerprint sensing device according to embodiments of the present disclosure will be described. FIG. 3A and FIG. 3B are schematic views of a light emitting mechanism of a fingerprint sensing device according to one embodiment of the present disclosure. Elements in FIG. 3A and FIG. 3B correspond to the sensing units 100, 100', and 100" in FIG. 1A to FIG. 1D, so the same elements are represented by the same reference numerals and will not be described again. Referring to FIG. 3A, the fingerprint sensing device in the present embodiment comprises an alternating current driving power supply AC, where one end of the alternating current driving power supply AC is electrically connected to the first anode AN1 of the light emitting element 130, and the other end of the alternating current driving power supply AC is contacted with a finger. When the finger presses the encapsulating layer 150 of the fingerprint sensing device, a capacitor may be formed in the fingerprint sensing device to drive the light emitting element 130 to emit light as shown in FIG. 3B. In particular, since the light emitting element 130 and the diode 140 are provided in the present embodiment and both serve as the two diodes having opposite polarities to form a current loop, when the finger contacts the encapsulating layer 150, the capacitor may be considered to be turned on in the alternating current condition. If only a single diode is used, it cannot be effectively turned on by means of the alternating current to cause the light emitting element 130 to emit light.

Accordingly, it can be known from the above embodiments that, since the fingerprint sensing device in the present embodiment does not comprise a backlight source and instead uses the light emitting element 130 as a front light source to emit light, and an upper electrode (the first cathode CA1) of the light emitting element 130 can be used to block sunlight, interference of ambient light can be completely obstructed, thereby solving the problem of the fingerprint sensing device not being able to read under sunlight. More particularly, since the light emitting element 130 and the diode 140 of the present disclosure have opposite polarities, are of a parallel structure, and can be turned on by means of an alternating current, the current can be transmitted through the encapsulating layer 150 through crests of a fingerprint, thereby forming a light emitting mechanism in which the light emitting element 130 is controlled by ridges of the fingerprint.

Figure 4A:
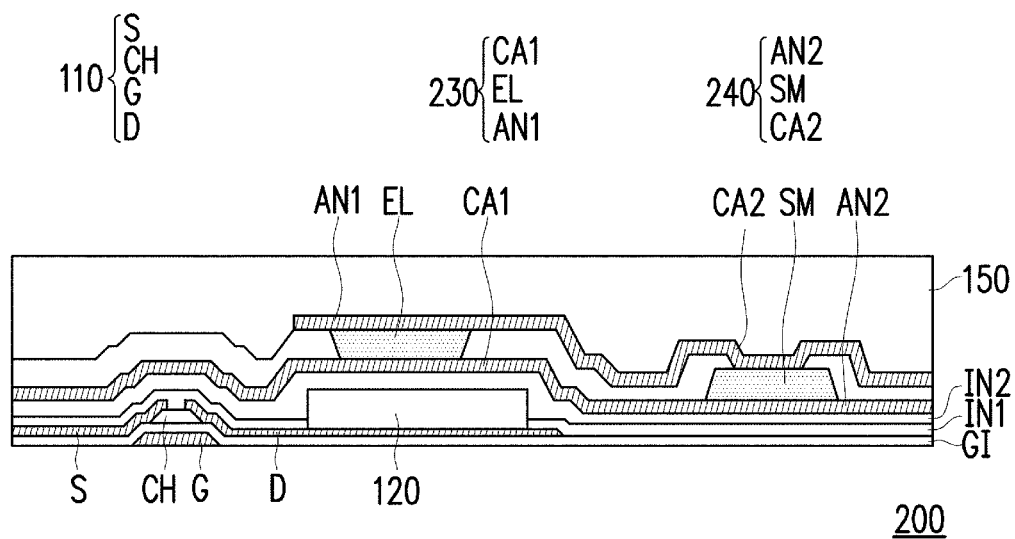
FIG. 4A is a schematic sectional view of a sensing unit of a fingerprint sensing device according to another embodiment of the present disclosure.
Figure 4B:
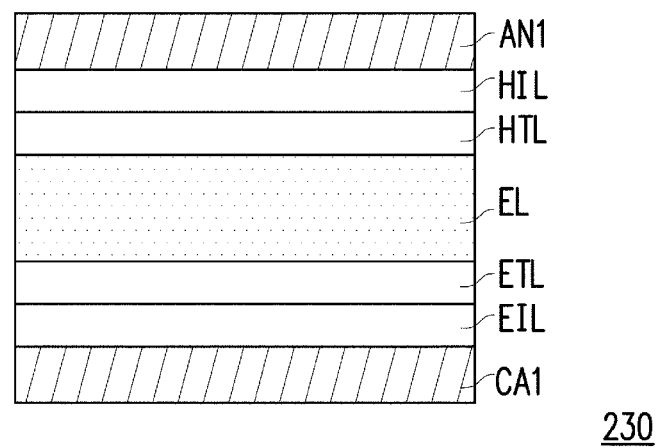
FIG. 4B is a schematic sectional view of the light emitting element in the embodiment in FIG. 4A.

FIG. 4A is a schematic sectional view of a sensing unit of a fingerprint sensing device according to another embodiment of the present disclosure. FIG. 4B is a schematic sectional view of the light emitting element in the embodiment in FIG. 4A. Please refer to FIG. 4A and FIG. 4B at the same time. The sensing unit 200 in FIG. 4A and FIG. 4B is similar to the sensing unit 100 in FIG. 1A, so the same elements are represented by the same reference numerals and will not be described again. The difference between the embodiment in FIG. 4A and FIG. 4B and the embodiment in FIG. 1A is that positions of the cathodes and anodes in the light emitting element 230 and the diode 240 are reversed.

In particular, referring to FIG. 4A and FIG. 4B, the light emitting layer EL of the light emitting element 230 is located above the first cathode CA1 and the first anode AN1 is located above the light emitting layer EL. In other words, in the present embodiment, the first cathode CA1 is located in the light emitting element 230 at a side close to the photosensitive element 120. The first cathode CA1 is made of a transparent conductive material, such as indium tin oxide (ITO), but the present disclosure is not limited thereto. The first anode AN1 is located at the uppermost position in the light emitting element 230, serves as a separate metal layer of each sensing unit 200, and can be used to block sunlight. That is to say, the first anodes AN1 of the sensing units 200 in the present embodiment are not contacted with each other and are each a floating electrode. In addition, referring to FIG. 4B, compared with the light emitting element 130 in FIG. 1D, the light emitting element 230 is only of a vertically reversed structure, and thus will not be described and can be defined with reference to the foregoing.

In the present embodiment, the semiconductor layer SM of the diode 240 is located above the second anode AN2, and the second cathode CA2 is located above the semiconductor layer SM. In particular, the second anode AN2 is electrically connected to the first cathode CA1 of the light emitting element 230, and the second cathode CA2 is electrically connected to the first anode AN1 of the light emitting element 230. In the present embodiment, the first cathode CA1 and the second anode AN2 are the same film layer, and the first anode AN1 and the second cathode CA2 are the same film layer. In other words, the material of the second anode AN2 is the same as that of the first cathode CA1 and is a transparent conductive material, such as indium tin oxide (ITO), but the present disclosure is not limited thereto. In addition, the second cathode CA2 is located at the uppermost position in the diode 240, serves as a separate metal layer of each sensing unit 200, and can be used to block sunlight. That is to say, the second anodes AN2 of the sensing units 100 in the present embodiment are not contacted with each other and are each a floating electrode.

In addition, the current loop and the light emitting mechanism in the embodiment in FIG. 4A and FIG. 4B can be defined by referring to FIG. 2, FIG. 3A, and FIG. 3B from above. The only difference is that, compared with the previous embodiments, the positions of the first anode AN1, the first cathode CA1, the second anode AN2, and the second cathode CA2 in FIG. 4A and FIG. 4B are completely reversed. Similarly, in the present embodiment, since the fingerprint sensing device in the present embodiment does not comprise a backlight source and instead uses the light emitting element 230 as a front light source to emit light, and an upper electrode (the first anode AN1) of the light emitting element 230 can be used to block sunlight, interference of ambient light can be completely obstructed, thereby solving the problem of the fingerprint sensing device not being able to read under sunlight. More particularly, since the light emitting element 230 and the diode 240 of the present disclosure have opposite polarities, are of a parallel structure, and can be turned on by means of an alternating current, the current can be transmitted through the encapsulating layer 150 through crests of a fingerprint, thereby forming a light emitting mechanism in which the light emitting element 230 is controlled by ridges of the fingerprint.

To sum up, the present disclosure uses an upper electrode (the first cathode or the first anode) of the light emitting element to block sunlight and uses the light emitting element as a front light source, so that interference of ambient light can be completely obstructed, thereby solving the problem of the fingerprint sensing device not being able to read under sunlight. In addition, since the light emitting element and the diode of the present disclosure have opposite polarities, are of a parallel structure, and can be turned on by means of an alternating current, the current can be transmitted through the encapsulating layer through crests of a fingerprint, thereby forming a light emitting mechanism in which the light emitting element is controlled by ridges of the fingerprint.

Even though the present disclosure has been disclosed as the abovementioned embodiments, it is not limited thereto. Any person of ordinary skill in the art may make some changes and adjustments without departing from the spirit and scope of the present disclosure. Therefore, the scope of the present disclosure is defined in view of the appended claims.

What is claimed is:

1. A fingerprint sensing device, comprising a plurality of sensing units, wherein each of the sensing units comprises:
    a readout element;
    a photosensitive element, electrically connected to the readout element;
    a light emitting element, disposed corresponding to the photosensitive element and comprising a first anode, a first cathode, and a light emitting layer located between the first anode and the first cathode; and
    a diode, comprising a second anode and a second cathode, and a semiconductor layer located between the second anode and the second cathode, wherein the second anode is electrically connected to the first cathode of the light emitting element, and the second cathode is electrically connected to the first anode of the light emitting element.

2. The fingerprint sensing device according to claim 1, wherein the light emitting element and the diode are of a parallel structure.

3. The fingerprint sensing device according to claim 1, wherein the light emitting element and the diode do not overlap.

4. The fingerprint sensing device according to claim 1, wherein the first cathode and the second anode are the same film layer, and the first anode and the second cathode are the same film layer.

5. The fingerprint sensing device according to claim 1, wherein the light emitting element is located above the photosensitive element, and the light emitting element and the photosensitive element have a vertically stacked structure.

6. The fingerprint sensing device according to claim 1, wherein:
    the light emitting layer of the light emitting element is located above the first anode, and the first cathode is located above the light emitting layer; and
    the semiconductor layer of the diode is located above the second cathode, and the second anode is located above the semiconductor layer.

7. The fingerprint sensing device according to claim 1, wherein:
    the light emitting layer of the light emitting element is located above the first cathode, and the first anode is located above the light emitting layer; and
    the semiconductor layer of the diode is located above the second anode, and the second cathode is located above the semiconductor layer.

8. The fingerprint sensing device according to claim 1, wherein the light emitting element further comprises:
    an electron injection layer, located between the first cathode and the light emitting layer;
    an electron transport layer, located between the electron injection layer and the light emitting layer;
    a hole injection layer, located between the first anode and the light emitting layer; and
    a hole transport layer, located between the hole injection layer and the light emitting layer.

9. The fingerprint sensing device according to claim 1, wherein the semiconductor layer of the diode comprises:
    a P-type material layer, electrically connected to the second anode;
    an N-type material layer, electrically connected to the second cathode; and
    an intrinsic material layer, located between the P-type material layer and the N-type material layer.

10. The fingerprint sensing device according to claim 1, wherein the semiconductor layer of the diode comprises:
    a P-type material layer, electrically connected to the second anode;
    an N-type material layer, electrically connected to the second cathode.

11. The fingerprint sensing device according to claim 1, wherein the semiconductor layer of the diode comprises:
    an N-type material layer, electrically connected to the second cathode;
    an intrinsic material layer, electrically connected to the second anode.

12. The fingerprint sensing device according to claim 1, wherein the semiconductor layer of the diode comprises:
    a P-type material layer, electrically connected to the second anode; and
    an intrinsic material layer, electrically connected to the second cathode.

13. The fingerprint sensing device according to claim 1, wherein the readout element is an active element comprising a gate, a channel, a source, and a drain, wherein the drain is electrically connected to the photosensitive element.

14. The fingerprint sensing device according to claim 1, further comprising an encapsulating layer covering the readout element, the photosensitive element, the light emitting element, and the diode, wherein the encapsulating layer is made of a translucent or opaque material.

15. The fingerprint sensing device according to claim 1, further comprising an alternating current driving power supply, wherein one end of the alternating current driving power supply is electrically connected to the first anode of the light emitting element, and the other end of the alternating current driving power supply is contacted with a finger.

* * * * *